United States Patent [19]

Matsukawa

[11] Patent Number: 5,381,451

[45] Date of Patent: Jan. 10, 1995

[54] TRIGGER SIGNAL GENERATING CIRCUIT WITH EXTRANEOUS PULSE PREVENTION DURING ACCELERATED PULSE COUNTING

[75] Inventor: Takanari Matsukawa, Tokyo, Japan

[73] Assignee: NEC Corporation, Japan

[21] Appl. No.: 38,709

[22] Filed: Mar. 29, 1993

[30] Foreign Application Priority Data

Mar. 30, 1992 [JP] Japan .................................. 4-074532

[51] Int. Cl.⁶ .................................................. H03K 21/40
[52] U.S. Cl. ............................................ 377/20; 377/28; 377/55; 327/291
[58] Field of Search .................... 377/20, 55, 107, 28; 328/129.1

[56] References Cited

U.S. PATENT DOCUMENTS

| | | | |
|---|---|---|---|
| 3,801,917 | 4/1974 | Weinstein | 328/129.1 |
| 4,392,733 | 7/1983 | Beppu et al. | 328/129.1 |
| 4,968,907 | 11/1990 | Pepper | 377/20 |
| 4,979,194 | 12/1990 | Kawano | 377/55 |

*Primary Examiner*—John S. Heyman
*Attorney, Agent, or Firm*—Ostrolenk, Faber, Gerb & Soffen

[57] ABSTRACT

A signal generating circuit includes a counter for counting up input clock pulses to output a trigger signal when counting up to a predetermined number of pulses, a CPU for outputting a mask request of a first trigger signal, a first flip-flop for storing the mask request of the CPU, a second flip-flop for latching a normal output signal of the first flip-flop by the trigger signal of the counter, and an AND circuit for calculating a logical sum of a mask request signal output from the second flip-flop and the trigger signal output from the counter. Thus, the trigger signal generating circuit masks the first trigger signal output from the counter and prevents the output of a superfluous trigger signal when a timing of a trigger signal generation is delayed.

1 Claim, 4 Drawing Sheets

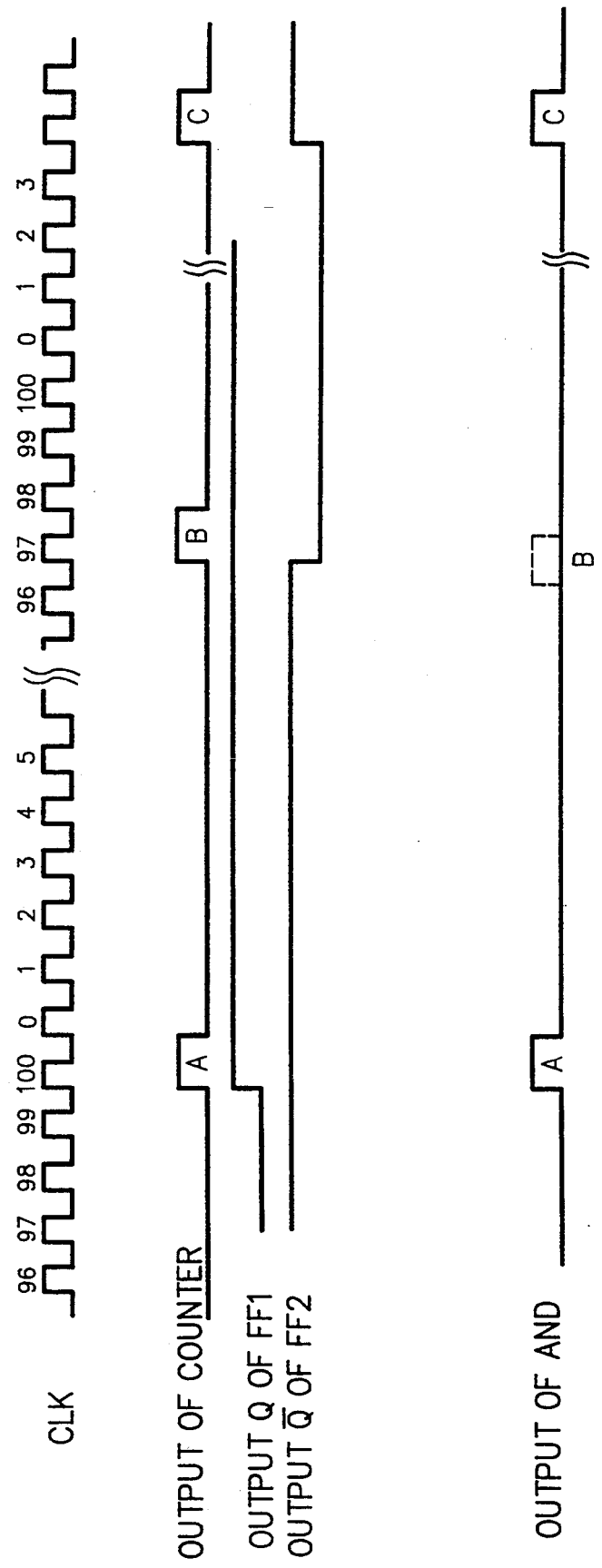

TRIGGER SIGNAL GENERATING CIRCUIT WITH EXTRANEOUS PULSE PREVENTION DURING ACCELERATED PULSE COUNTING

BACKGROUND OF THE INVENTION

The present invention relates to a circuit for generating a trigger signal, and more particularly to a trigger signal generating circuit capable of controlling a timing of a trigger signal generation by a parameter set output from a central processing unit.

Description of the Related Arts

In FIG. 1, there is shown a conventional trigger signal generating circuit which comprises a CPU (central processing unit) 1, a latch circuit 2 and a counter 3. The counter 3 counts up input clock pulses (CLKs) and, when the counter 3 counts up to a predetermined number of pulses, it outputs the trigger signal 6. This trigger signal 6 is input to a reset terminal R of the latch circuit 2 as a reset signal and a load terminal L of the counter 3 as an initial value read-in signal. In response to a trigger signal generation request output from the CPU 1 via an address bus 7 and a data bus; 8, the latch circuit 2 outputs a count start signal 9 to the counter 3.

In this trigger signal generating circuit, at a normal operation time, the counter 3 counts up the clock pulses for every input thereof, and, when the counter 3 counts up to a predetermined number of pulses, the counter 3 outputs the trigger signal 6. The trigger signal 6 becomes not only a trigger for generating another timing signal but also the initial value read-in signal of the counter 3 for a next count start. After reading in the initial value read-in signal, the counter 3 counts up the clock pulses again. Also, while the trigger signal 6 loads the initial value to the counter 3, the trigger signal 6 becomes the reset signal for resetting the content of the latch circuit 2. In this normal operation, the output timing of the trigger signal 6 from the counter 3 is fixed.

Now, when the generation timing of the trigger signal 6 is accelerated, the CPU 1 outputs a timing change request of a trigger signal generation to the latch circuit 2 via the address bus 7 and the data bus 8 so as to set a value of at least "1" in the latch circuit 2. Thus, the trigger signal is generated from the counter 3, the value of at least "1" as the initial value is input to the counter 3, and hence the time until the counter 3 counts the predetermined number of pulses is shortened. As a result, the generation timing of the trigger signal 6 is accelerated.

FIG. 2 shows waveforms of a clock pulse (CLK) input to the counter 3 and a trigger signal 6 output therefrom. In the conventional trigger signal generating circuit, when the timing of the trigger signal generation is delayed, the CPU 1 determines a somewhat smaller predetermined value such as 97 than a predetermined count-out value such as loll of the counter 3 in the latch circuit 2.

Accordingly, as shown in FIG. 2, the counter 3 counts up to the 97th clock pulse from a trigger signal A and then generates a next trigger signal B to start the count-up again from "0" to "100", and then the counter 3 counts up to the 100th clock pulse and then generates a next trigger signal C. In this case, two trigger signals 6 are generated from the counter 3, that is, one trigger signal B is superfluous.

SUMMARY OF THE INVENTION

It is therefore an object of the present invention to provide a trigger signal generating circuit in view of the aforementioned problem of the prior art, which is capable of generating a trigger signal depending on a delay time determined by a central processing unit without outputting a superfluous trigger signal when a timing of a trigger signal generation is delayed.

In accordance with one aspect of the present invention, there is provided a trigger signal generating circuit, including a counter for counting up input clock pulses to output a trigger signal when counting up to a predetermined number of pulses; a latch circuit for outputting a count start signal to the counter and inputting the trigger signal as a reset signal; a signal generation timing change device for outputting a timing change request of a trigger signal generation and a mask request of a first trigger signal output from the counter; and a trigger signal mask device for masking the first trigger signal when the signal generation timing change device outputs the mask request.

More specifically, the trigger signal mask device includes a first flip-flop for storing the mask request output from the signal generation timing change device and outputting a normal output signal: a second flip-flop for latching the normal output signal output from the first flip-flop by using the trigger signal as a clock input and outputting an inversion output signal as a clear signal of the mask request to the first flip-flop: and an AND circuit for masking the first trigger signal depending on the mask request by using the trigger signal output from the counter and the inversion output signal output from the second flip-flop.

In this trigger signal generating circuit, when the signal generation timing change device outputs a count start command and the mask request to the latch circuit and the first flip-flop, the latch circuit outputs the count start signal to the counter. Thus, the counter counts up the clock pulses in synchronism with the clock input, and when the counter counts up to a predetermined number of pulses, the counter outputs the trigger signal to one input terminal of the AND circuit. On the other hand, the mask request output from the signal generation timing change device is stored in the first flip-flop, and its normal output signal is fed to the second flip-flop for latching. The inversion output signal of the second flip-flop is input to another input terminal of the AND circuit. In the AND circuit, a logical sum of the two input signals and a first trigger signal output from the counter is masked. Also, since the inversion output signal of the second flip-flop is supplied to the reset terminal of the first flip-flop, the normal output signal of the first flip-flop and the inversion output signal of the second flip-flop are inverted, and the mask request is released to output the trigger signal through the AND circuit.

BRIEF DESCRIPTION OF THE DRAWINGS

The objects, features and advantages of the present invention will become more apparent from the consideration of the following detailed description, taken in conjunction with the accompanying drawings, in which;

FIG. 1 is a timing chart showing an operation of the trigger signal generating circuit shown in FIG. 3.

DESCRIPTION OF THE PREFERRED EMBODIMENT

Figure 1:
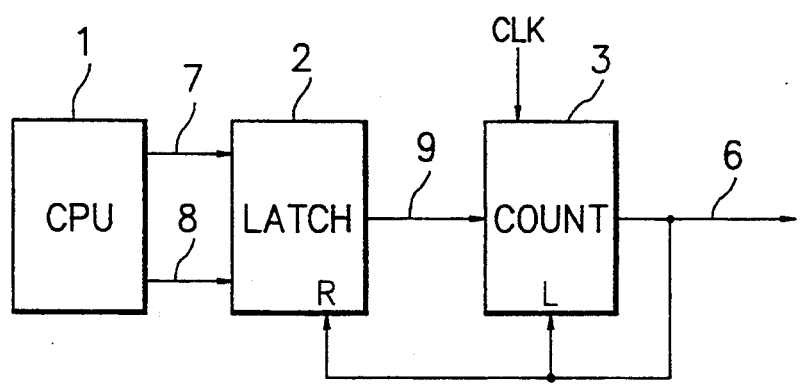
FIG. 1 is a block diagram of a conventional trigger signal generating circuit.
Figure 2:
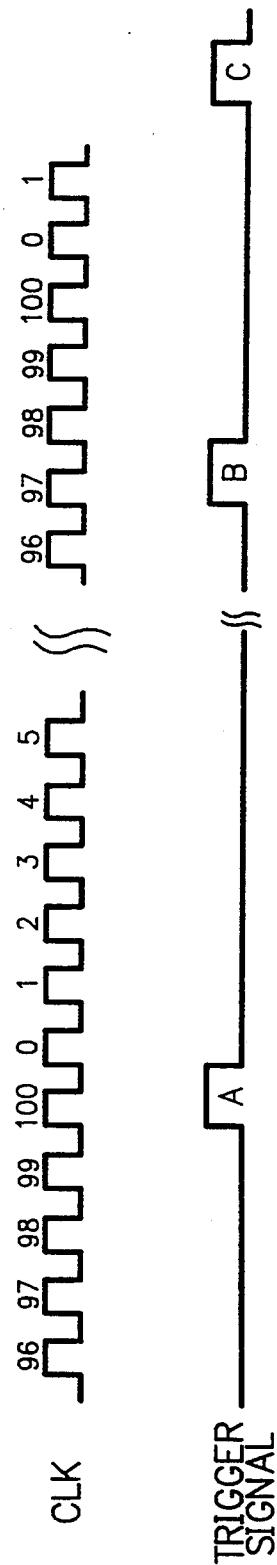
FIG. 2 is a timing chart showing an operation of the trigger signal generating circuit shown in FIG. 1 when a timing of a trigger signal generation is delayed.
Figure 3:
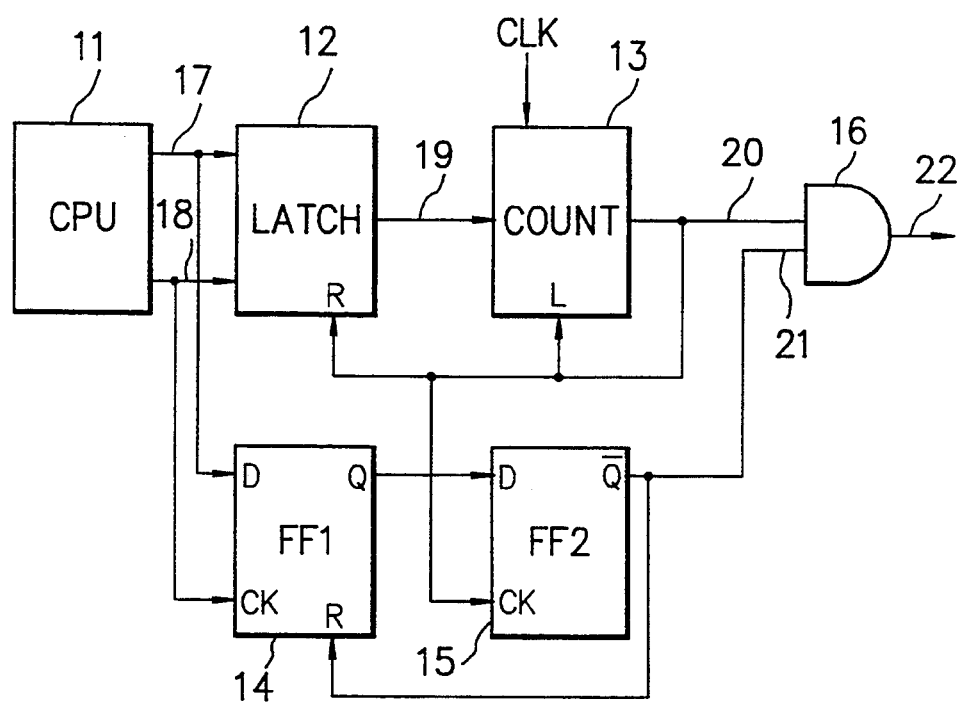
FIG. 3 is a block diagram of a trigger signal generating circuit according to the present invention.

Referring now to tile drawings, there is shown in FIG. 3 one embodiment of a trigger signal generating circuit according to the present invention.

As shown in FIG. 3, in the trigger signal generating circuit, a counter 13 counts up input clock pulses (CLKs), and when the counter 13 counts up to a predetermined number of pulses, the counter 13 outputs a trigger signal 20. This trigger signal 20 is input to a reset terminal R of a latch circuit 12 as a reset signal and a load terminal L of the counter 13 as an initial value read-in signal. In response to a trigger signal generation request output from a CPU 11 via an address bus 17 and a data bus 18, the latch circuit 12 outputs a count start signal 19 to the counter 13. The CPU 11 is further adapted to output a timing change request of a trigger signal generation and a mask request of the first trigger signal. The mask request output from the CPU 11 is also supplied to a data input terminal D and a clock input terminal CK of a first flip-flop (FF1) 14 via the address bus 17 and the data bus 18. A normal output signal of the first flip-flop 14 is supplied from a normal output terminal Q of the first flip-flop 14 to a data input terminal D of a second flip-flop (FF2) 15. The trigger signal 20 output from the counter 13 is also input to a clock input terminal CK elf the second flip-flop 15. The second flip-flop 15 latches the signal input to the data input terminal D and outputs an inversion output signal as a mask request signal 21 from an inversion output terminal Q to one input terminal of an AND circuit 16. The second flip-flop 15 also outputs the inversion output signal as a clear signal to a reset terminal R of the first flip-flop 14. The trigger signal 20 output from tile counter 13 is also input to another input terminal of the AND circuit 16. The AND circuit 16 calculates a logical sum of the trigger signal 20 and the mask request signal 21 and outputs the trigger signal 20 as a trigger signal 22 only when the mask request signal 21 is a high level. The AND circuit 16 masks the trigger signal 20 when the mask request signal 21 is at a low level.

Next, the operation of the trigger signal generating circuit described above when the trigger signal generation timing is delayed will now be described in detail in connection with FIG. 4 which shows tile waveforms of the clock pulses (CLK) and the output signals of the counter 13, the first flip-flop 14, the second flip-flop 15 and the AND circuit 16.

When the timing of the trigger signal generation is delayed, the CPU 11 outputs a set signal of a smaller value than a normal predetermined count-out value such as "100" as the timing change request of the trigger signal generation as well as the mask request to the latch circuit 12 and the first flip-flop 14 via the address bus 17 and the data bus 18. The latch circuit 12 outputs this set signal to the counter 18. In response to the set signal, tile counter 13 counts up to the smaller predetermined count-out clock pulse number from a trigger signal A and generates a next trigger signal B to start the count-up again from "0" to "100", and the counter 13 then counts up to the 100th clock pulse before generating a next trigger signal C in the same manner as the conventional trigger signal generating circuit. In this case, when the counter 13 counts up to the predetermined number of pulses, the trigger signal 20 is supplied to the one terminal of the AND circuit 16 and the load terminal of the counter 13. Hence, the counter 13 starts to count up the clock pulse again from "0". The trigger signal 20 is also supplied to the clock input terminal CK of the second flip-flop 15.

On the other hand, in the first flip-flop 14, the high level signal "H" is output from the normal output terminal for every clock pulse input via the data bus 18, and the high level signal "H" is fed to the data input terminal of the second flip-flop 15. In the second flip-flop 15, when the trigger signal B is supplied from the counter 18 to the clock pulses input terminal, the low level signal "L" is output from the inversion output terminal to the another terminal of the AND circuit 16. As a result, the AND circuit 16 outputs the low level signal "L". That is, the first trigger signal B output from the counter 18 can be masked.

Further, the low level signal "L" output from the inversion output terminal of the second flip-flop 15 is supplied to the reset terminal of the first flip-flop 14 as the reset signal to reset the first flip-flop 14. Hence, the first flip-flop 14 outputs the low level signal "L" from the normal output: terminal to the data input terminal of the second flip-flop 15. As a result, the second flip-flop 15 outputs the high level signal "H" from the inversion output terminal to the AND circuit 16, and thus the AND circuit 16 outputs the high level signal "H" as the trigger signal 22. That is, the second trigger signal C output from the counter 13 is not masked and is output from the AND circuit 16.

In the trigger signal generating circuit of this embodiment, as described above, by the mask request output from the CPU 11, the first trigger signal B is masked and the second trigger signal C is output at the delayed timing of the trigger signal generation.

As described above, according to the present invention, in the trigger signal generating circuit, since a trigger signal mask device for masking the first trigger signal output from the counter is provided, even when the timing of tile trigger signal generation is delayed, a superfluous trigger signal can be masked and thus the trigger signal can be generated depending on a predetermined delay time without outputting the superfluous trigger signal.

While the present invention has been described with reference to the particular illustrative embodiment, it is not to be restricted by that embodiment but only by the appended claims. It is to be appreciated that those skilled in the art can change or modify the embodiment without departing from the scope and spirit of the present invention.

What is claimed is:

1. A trigger signal generating circuit, comprising:
   a) a counter for counting up input clock pulses to output a trigger signal when counting up to a predetermined number of pulses;
   b) a latch circuit for outputting a count start signal to the counter and inputting the trigger signal as a reset signal;
   c) a signal generation timing change device for outputting a timing change request of a trigger signal generation and a mask request of a first trigger signal output from the counter; and d) a trigger signal masking device for masking the first trigger signal when the signal generation timing change device outputs the mask request, the trigger signal masking device including:
 1) a first flip-flop for storing the mask request output from the signal generation timing change device and outputting a normal output signal;
 2) a second flip,-flop for latching the normal output signal output from the first flip,flop by using the trigger signal as a clock input and outputting an inversion output signal as a clear signal of the mask request to the first flip-flop; and
 3) an AND circuit for masking the first trigger signal depending on the mask request by using the trigger signal and output from the counter and the inversion input signal output from the second flip-flop.

* * * * *